United States Patent [19]

Nakano et al.

[11] Patent Number: 4,487,505
[45] Date of Patent: Dec. 11, 1984

[54] APPARATUS FOR PROCESSING A SIGNAL FOR ALIGNMENT

[75] Inventors: Shigeki Nakano, Tokyo; Yasuyoshi Yamada, Kawasaki; Ryozo Hiraga, Yokohama, all of Japan

[73] Assignee: Canon Kabushiki Kaisha, Tokyo, Japan

[21] Appl. No.: 419,512

[22] Filed: Sep. 17, 1982

[30] Foreign Application Priority Data

Sep. 24, 1981 [JP] Japan ............................... 56-151531

[51] Int. Cl.³ ...................... G02B 21/06; G01B 11/00
[52] U.S. Cl. ..................................... 356/400; 356/401
[58] Field of Search .................... 356/399, 400, 401

[56] References Cited

U.S. PATENT DOCUMENTS

| | | | |
|---|---|---|---|
| 4,167,677 | 9/1979 | Suzki ............................... | 356/401 |
| 4,219,719 | 8/1980 | Frosien et al. ..................... | 356/401 |
| 4,251,129 | 2/1981 | Suzki et al. ........................ | 356/401 |
| 4,406,546 | 9/1983 | Suzuki ............................. | 356/400 |

Primary Examiner—R. A. Rosenberger
Attorney, Agent, or Firm—Fitzpatrick, Cella, Harper & Scinto

[57] ABSTRACT

An apparatus for processing a signal for aligning a mask having at least one standard mark thereon with a wafer having at least one reference mark thereon, includes a first sensor for sensing the standard mark, a second sensor for sensing the reference mark through the mask, a threshold value determining circuit for detecting a peak value from a signal stream put out by the first sensor and determining a first threshold value and for detecting a peak value from a signal stream put out by the second sensor and determining a second threshold value, a signal converting circuit for converting a signal of a higher level than the first threshold value from the signal stream put out by the first sensor into a first digital signal and for converting a signal of a higher level than the second threshold value from the signal stream put out by the second sensor into a second digital signal, and a composing circuit for composing the first digital signal and the second digital signal.

6 Claims, 6 Drawing Figures

APPARATUS FOR PROCESSING A SIGNAL FOR ALIGNMENT

BACKGROUND OF THE INVENTION

1. Field of the Invention

This invention relates to an apparatus for sensing the alignment marks of two objects when the two objects are to be aligned with each other, extracting a necessary signal component from each sensed signal, and composing the extracted signals to obtain a desirable signal.

2. Description of the Prior Art

During the patterning in the process of manufacturing semiconductors, a wafer and a mask must be aligned with high accuracy and recently, this is usually accomplished automatically. In the automatic aligning process, photoelectric detecting means are generally used to detect the position of an object. For example, in an apparatus of the prior art, the object is scanned by using a laser light as a light source and the light beams scattered from alignment mark patterns W and M on the wafer and mask shown, for example, in FIGS. 1A and 1B of the accompanying drawings are photoelectrically detected by a photodiode and, by utilizing the fact that the output signal thereof includes the information on the distance between the patterns W and M, the relative position of the wafer and mask is detected. Such aligning is accomplished by directing the mark patterns W and M detected in the described manner into a positional relation as shown in FIG. 1C. The mark patterns W and M and a pattern constituting an actual element are in a predetermined relation and therefore, if the mark patterns W and M are directed into a predetermined positional relation, the actual element patterns on the wafer and mask are properly aligned. If the positional relation between the mark patterns W and M is detected, the difference between that positional relation and the predetermined relation may be examined and a driving mechanism may be operated so that this difference becomes null. The aligning of the wafer and mask requires all the degree of two-dimensional freedom to be controlled and is usually accomplished by observing a plurality of locations on the wafer and mask.

The alignment marks depicted in FIGS. 1A and 1B are known from U.S. Pat. No. 4,167,677 of the present assignee.

On the other hand, when the coherent lights coming back from a set of marks on the wafer and mask are detected by a single photoelectric detector, the two lights interfere with each other to provide an unstable signal and this has led to the disadvantage that automatic aligning becomes impossible or the accuracy of aligning is aggravated.

In a specific example shown in FIG. 5 of U.S. Pat. No. 4,251,129 of the present assignee, the light signals from the wafer and mask are detected by different photoelectric detectors, wereby a stable signal is obtained. However, even if great improvements have been made by this apparatus, undesirable signals concerning the mark on another object to be detected may be present in the signals produced by the detectors. On the other hand, the peak signals of the obtained signals which correspond to the mark patterns W and M tend to be wide in their rising width, but the levels of the peak signals are not always higher than a predetermined level. Therefore, it is very difficult to sharpen the signals by determining a peak cut value, to obtain aligning information of high accuracy.

SUMMARY OF THE INVENTION

It is an object of the present invention to eliminate undesirable signals which reduce the accuracy of alignment when two objects are to be aligned with high accuracy.

It is another object of the present invention to separately detect light signals coming back from a mask and a wafer which are the objects to be aligned, and amplitude-discriminate these light signals at a relative threshold value in accordance with the amplitude of a stable signal component and thereby convert an analog signal indicative of the alignment pattern into a digital signal to thereby effect aligning with high accuracy.

It is still another object of the present invention to eliminate any noise component cause by the light reflected from the surface of the mask or the wafer.

The invention will become fully apparent from the following detailed description thereof taken in conjunction with the accompanying drawings.

DESCRIPTION OF THE PREFERRED EMBODIMENTS

Figure 1A:
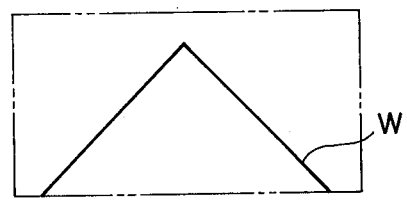
FIGS. 1A, 1B and 1C illustrate the mark patterns on a wafer and a mask.
Figure 1B:
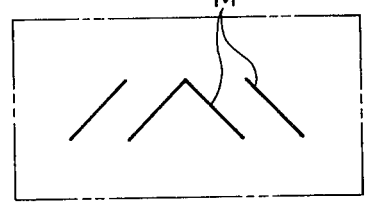
Figure 1C:
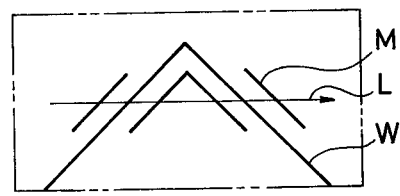
Figure 2:
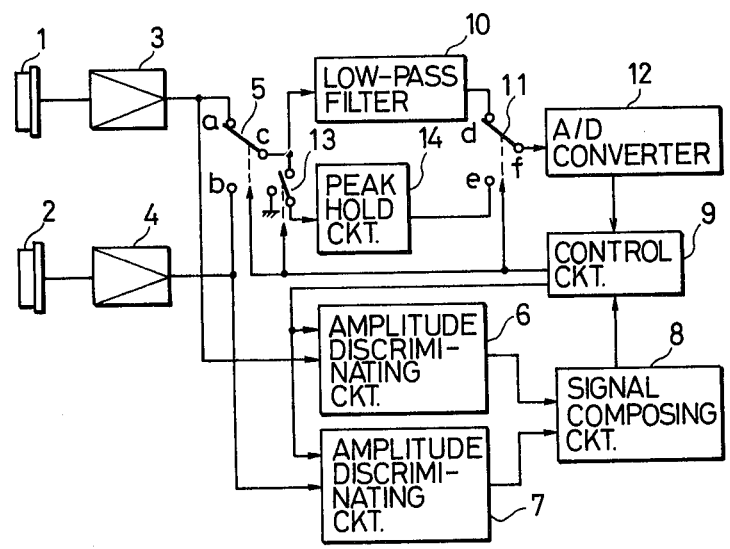
FIG. 2 is a block circuit diagram showing an embodiment of the aligning signal processing apparatus according to the present invention.
Figure 4:
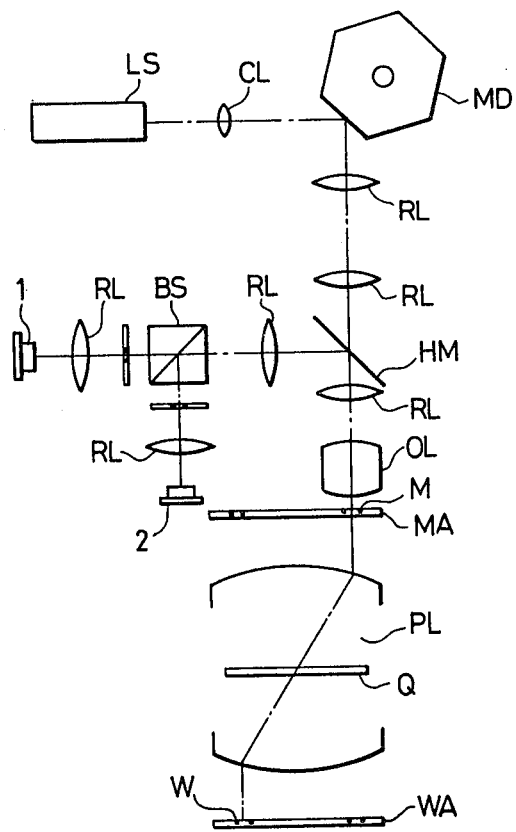
FIG. 4 is a cross-sectional view of an optical system for detecting the mark patterns in accordance with the invention.

Referring to FIG. 2, reference numeral 1 designates a first photoelectric detector for detecting a light signal coming back from a wafer, and reference numeral 2 denotes a second photoelectric detector for detecting a light signal from a mask. These photoelectric detectors 1 and 2 are disposed, for example, in the mark detecting device of FIG. 4. In FIG. 4, MA designates a mask provided with an integrated circuit pattern, WA denotes a wafer provided with a photoresist layer, and PL designates a projection lens, which makes the mask MA and the wafer WA conjugate. M designates the alignment mark of the mask and W denotes the alignment mark of the wafer. OL designates an objective lens, RL denotes relay lenses, and CL designates a condenser lens. HM designates a half-mirror, MD denotes a mirror drum rotated at a high speed, BS designates a polarizing beam splitter, Q denotes a quarter wave plate, and LS designates a laser light source which produces a linearly polarized laser beam. The laser beam emitted from the laser light source LS scans the marks M and W by means of the mirror drum MD, while the light from the mark W mainly enters the photoelectric detector 1 and the light from the mark M mainly enters the photoelectric detector 2.

The photoelectric detectors 1 and 2 of FIG. 2 are connected to first and second amplifiers 3 and 4, respectively. The output of the first amplifier 3 is connected to a noncontact change-over switch 5 which alternatively changes over the output signals of the first amplifier 3 and the second amplifier 4 and also to a first amplitude discriminating circuit 6. The output of the second amplifier 4 is applied as input to the change-over switch 5 and to a second amplitude discriminating circuit 7. The outputs of the first and second amplitude discriminating circuits 6 and 7 are connected to a control circuit 9 provided with an operational portion and a memory portion, via a signal composing circuit 8 which selectively extracts only necessary signal components and composes them.

On the other hand, the output of the first or second amplifier 3 or 4 passed through the switch 5 is delivered via a low-pass filter 10 and a change-over switch 11 to an A/D converter 12 and further to the control circuit 9. The aforesaid output of the first or second amplifier 3 or 4 is further transmitted to a peak hold circuit 14 via a switch 13 and is connected to the A/D converter 12 through the change-over switch 11. The control circuit 9 stores and calculates the value obtained from the A/D converter 12 and the signal composing circuit 8, and delivers the calculated threshold value to the first and second amplitude discriminating circuits 6 and 7 and further transmits a change-over instruction signal to the change-over switches 5 and 11 and the switch 13.

Figure 3:
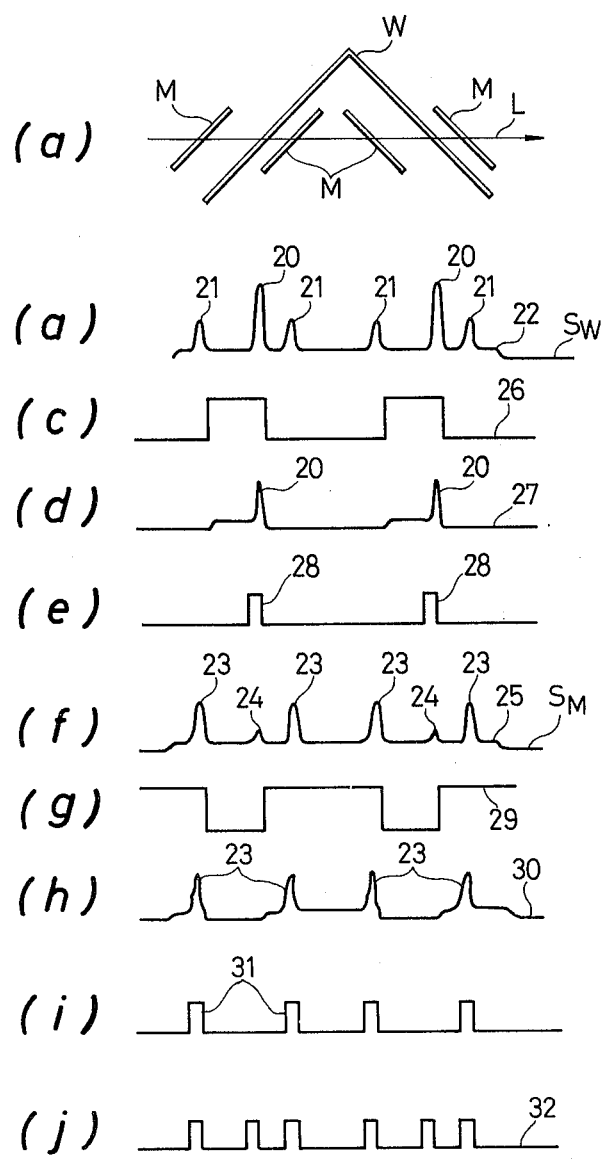
FIG. 3 illustrates at the part (a) the mark patterns of the wafer and mask superposed one upon the other, and illustrates at the parts (b)–(j), with time charts, the operation of the circuit.

When, for example, the mark patterns W and M of the wafer and mask are in a positional relation as shown in part (a) of FIG. 3, the mark pattern W of the wafer is detected by the first photoelectric detector 1 under the scanning of the laser light L. The detection signal $S_W$ detected by the first photoelectric detector 1, as shown in part (b) of FIG. 3, includes, in addition to the pattern signals 20 by the original mark pattern W, unstable signals 21 on the mark pattern M of the mask caused by interference phenomenon. The detection signal $S_W$ further includes a bias-like signal 22 produced by the light uniformly reflected from the wafer surface. On the other hand, the detection signal $S_M$ shown in part (f) of FIG. 3 detected by the second photoelectric detector 2 includes, in addition to pattern signals 23 based on the mark pattern M of the mask, the signals 24 of slight level due to the mark pattern W of the wafer and a signal 25 caused by the uniform reflected light from the mask surface. Scanning of the laser light L is effected several times, and the detection signals $S_W$ and $S_M$ are normally input to the amplitude discriminating circuits 6 and 7, respectively, so that these signals are converted into digital signals, whereafter they are made into timing command signals in the signal composing circuit 8. On the other hand, the detection signals are input to the low-pass filter 10 and the peak hold circuit 14 while being alternatively selected by the change-over switch 5 which is actuated by the change-over signal of the control circuit 9. If the terminals a and c are made to conduct in the change-over switch 5, the detection signal $S_W$ of the wafer is input to the low-pass filter 10 and the peak hold circuit 14 and, in the low-pass filter 10, the peaks 20 and 21 of the detection signal $S_W$ are cut and thus, only the uniform signal 22 passes through the low-pass filter.

On the other hand, the detection signal $S_W$ is input to the peak hold circuit 14 via the switch 13. Since the portions requisite to the detection signal $S_W$ are the second and fifth signals 20 as counted in the scanning direction, the switch 13 is closed in response to the command signal of the control circuit 9 at a timing, such as shown by signal 26 in FIG. 3(c), permitting passage of only the second and fifth pulses. Accordingly, the signal input to the peak hold circuit 14 is made into a signal 27 as shown in FIG. 3(d) and the peak value of the pattern signal 20 in this signal 27 is held and delivered to the A/D converter 12 via the change-over switch 11. This held signal and the signal from the low-pass filter 10 are converted into digital amounts by the A/D converter 12 and input to the control circuit 9, where these are subjected to subtraction, whereby the peak value of the pattern signal 20 of the wafer can be detected.

This peak value is multiplied by a certain predetermined value smaller than "1" and is thereby made into a threshold value, which is delivered to the amplitude discriminating circuit 6. In the amplitude discriminating circuit 6, the detection signal $S_W$ is converted into digital form, and only the peak signal which has reached the aforementioned threshold value is held which in turn is converted into a rectangular, pulse signal 28 having a predetermined height as shown in FIG. 3(e) and having a width at the threshold value, and then is put out to the signal composing circuit 8.

On the other hand, the detection signal $S_M$ representing the mark pattern M of the mask shown in FIG. 3(f) is input to the low-pass filter 10, etc. only when the terminals b and c of the change-over switch 5 have conducted, and the switch 13 is actuated by a command signal 29 shown in FIG. 3(g) which is contrary to a command signal 26 shown in FIG. 3(c). The subsequent processing is similar to that applied to the previously described detection signal $S_W$ and, via a signal 30 shown in FIG. 3(h), a pulse signal 31 shown in FIG. 3(i) is delivered from the amplitude discriminating circuit 7. Further, in the signal composing circuit 8, pulse signals 28 and 31 shown in FIGS. 3(e) and 3(i) are combined to compose a signal 32 shown in FIG. 3(j), which signal 32 is supplied to the control circuit 9 for use for aligning operation.

The present invention is not restricted to the abovedescribed embodiment, but is also applicable to a case where, for example, three alignment mark patterns are used. Also, if the peak values of the detection signals $S_W$ and $S_M$ are fed back to the first stage amplifier to constitute an auto gain control circuit and the amplitude thereof is made constant, the threshold value will also become constant and it will become possible to eliminate the control circuit.

As described above, in the aligning signal processing apparatus according to the present invention, if the signal from the wafer or mask also includes a signal from the mask or wafer mark pattern and further, even if a difference is caused between the uniform reflected lights from the wafer surface and the mask surface by the difference in reflection factor between these surfaces, the resultant digital signals of the mark patterns are stable and sharp and thus, there can be provided a highly accurate aligning signal.

What we claim is:

1. A signal processing apparatus usable with a first object having at least one first mark pattern and a second object having at least one second mark pattern thereon, said apparatus comprising:
    first sensing means for sensing said first mark pattern and putting out a first signal strem containing a desirable signal portion indicative of said first mark pattwern and an undesirable signal portion indicative of information unavoidably sensed by said first sensing means;
    second sensing means for sensing said second mark pattern and putting out a second signal stream containing a desirable signal portion indicative of said second mark pattern and an undesirable signal portion indicative of information unavoidably sensed by said second sensing means;

extracting means for extracting said desirable signal portion indicative of said first mark pattern from said first signal stream and for extracting said desirable signal portion indicative of said second mark pattern from said second signal stream;

threshold value determining means for determining a first threshold value from the peak value of the desirable signal portion indicative of said first mark pattern extracted from said first signal stream and for determining a second threshold value from the peak value of the desirable signal portion indicative of said second mark pattern extracted from said second signal stream;

signal converting means for converting a signal of a higher level in the first signal stream than the first threshold value into a first digital signal and for converting a signal of a higher level in the second signal stream than the second threshold value into a second digital signal; and signal composing means for composing the first digital signal and the second digital signal.

2. A signal processing apparatus according to claim 1, further comprising means for generating a timing signal from said first and second signal streams and wherein said extracting means extracts the desirable portions of said signals indicative of said respective first and second mark patterns in accordance with said timing signal.

3. A signal processing apparatus accoring to claim 2, wherein said timing signal generating means generates said timing signal by amplitude-discriminating said signal streams.

4. A signal processing apparatus according to claim 1, further comprising means for filtering said first and second signal streams and for producing first and second filtered signals; said threshold value determining means including a noise mitigating means for mitigating noise in said desirable signal portions indicative of said first and second mark patterns, respectively extracted by said extracting means, with said first and second filtered signals.

5. A signal processing apparatus according to claim 1, wherein said first object is a mask provided with an integrated circuit pattern and said second object is a wafer provided with a photoresist layer.

6. A signal processing apparatus according to claim 6, said apparatus being operable with a projection lens; and wherein said mask and said wafer are conjugate with respect to the projection lens.

* * * * *